(12) United States Patent
Noda et al.

(10) Patent No.: US 9,917,025 B2
(45) Date of Patent: Mar. 13, 2018

(54) PRINTED WIRING BOARD AND METHOD FOR MANUFACTURING PRINTED WIRING BOARD

(71) Applicant: IBIDEN CO., LTD., Ogaki-shi (JP)

(72) Inventors: Kota Noda, Ogaki (JP); Takeshi Furusawa, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 217 days.

(21) Appl. No.: 14/741,011

(22) Filed: Jun. 16, 2015

(65) Prior Publication Data
US 2015/0366061 A1 Dec. 17, 2015

(30) Foreign Application Priority Data
Jun. 17, 2014 (JP) .................. 2014-124044

(51) Int. Cl.
*H05K 1/11* (2006.01)
*H05K 1/14* (2006.01)
(Continued)

(52) U.S. Cl.
CPC ........ *H01L 23/13* (2013.01); *H01L 23/49822* (2013.01); *H01L 23/49827* (2013.01); *H01L 23/49833* (2013.01); *H01L 23/49838* (2013.01); *H01L 25/105* (2013.01); *H05K 3/4697* (2013.01); *H01L 23/49811* (2013.01); (Continued)

(58) Field of Classification Search
CPC ..... H01L 2924/00014; H01L 2224/131; H01L 2224/81395; H01L 2224/81411; H01L 2224/81444; H01L 2224/81447; H01L 2224/81464; H01L 2924/014;
(Continued)

(56) References Cited

U.S. PATENT DOCUMENTS

| 4,886,699 A * | 12/1989 | Carroll ............... B32B 5/26 |
| | | 174/256 |
| 6,757,176 B1 * | 6/2004 | Jiang ............... H01L 23/145 |
| | | 361/720 |

(Continued)

FOREIGN PATENT DOCUMENTS

JP     2007-123524     5/2007

OTHER PUBLICATIONS

U.S. Appl. No. 14/741,122, filed Jun. 16, 2015, Noda, et al.

*Primary Examiner* — Yuriy Semenenko
(74) *Attorney, Agent, or Firm* — Oblon, McClelland, Maier & Neustadt, L.L.P.

(57) ABSTRACT

A printed wiring board includes a first circuit board having a first surface and a second surface, and a second circuit board having a third surface and a fourth surface and having a mounting area on the third surface of the second circuit board. The first circuit board is laminated on the third surface of the second circuit board such that the first surface of the first circuit board is in contact with the third surface of the second circuit board, the first circuit board includes reinforcing material and has an opening portion exposing the mounting area of the second circuit board, and the first circuit board and the second circuit board are formed such that a ratio H1/h1 is in a range that is greater than 0.75 and smaller than 2.4, where H1 represents a thickness of the first circuit board and h1 represents a thickness of the second circuit board.

20 Claims, 8 Drawing Sheets

(51) Int. Cl.
  *H01L 23/13* (2006.01)
  *H05K 3/46* (2006.01)
  *H01L 25/10* (2006.01)
  *H05K 1/02* (2006.01)
  *H01L 23/498* (2006.01)
  *H01L 23/00* (2006.01)

(52) U.S. Cl.
  CPC .............. *H01L 24/13* (2013.01); *H01L 24/16* (2013.01); *H01L 2224/131* (2013.01); *H01L 2224/16227* (2013.01); *H01L 2224/16237* (2013.01); *H01L 2224/81192* (2013.01); *H01L 2224/81395* (2013.01); *H01L 2224/81411* (2013.01); *H01L 2224/81444* (2013.01); *H01L 2224/81447* (2013.01); *H01L 2224/81464* (2013.01); *H01L 2225/1023* (2013.01); *H01L 2225/1058* (2013.01); *H01L 2225/1088* (2013.01); *H01L 2924/15153* (2013.01); *H05K 1/0271* (2013.01); *H05K 2201/09827* (2013.01); *H05K 2201/10674* (2013.01); *Y10T 29/49158* (2015.01)

(58) Field of Classification Search
  CPC . H01L 2224/16227; H01L 2224/16237; H01L 2224/81192
  See application file for complete search history.

(56) References Cited

U.S. PATENT DOCUMENTS

| | | | |
|---|---|---|---|
| 2003/0137056 A1* | 7/2003 | Taniguchi | H01L 23/49827 257/774 |
| 2004/0150118 A1* | 8/2004 | Honda | H01L 21/563 257/778 |
| 2008/0257591 A1* | 10/2008 | Ikeda | H05K 1/119 174/255 |
| 2009/0115049 A1* | 5/2009 | Shiraishi | B81C 1/0023 257/698 |
| 2012/0018772 A1* | 1/2012 | Nishijima | H01L 33/486 257/99 |
| 2012/0212919 A1* | 8/2012 | Mano | H05K 1/185 361/782 |

\* cited by examiner

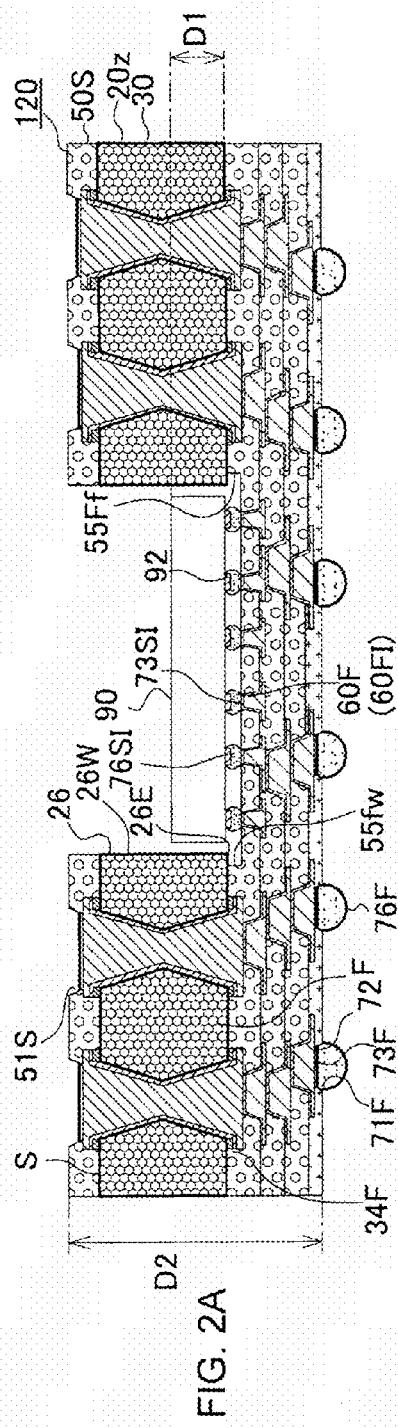
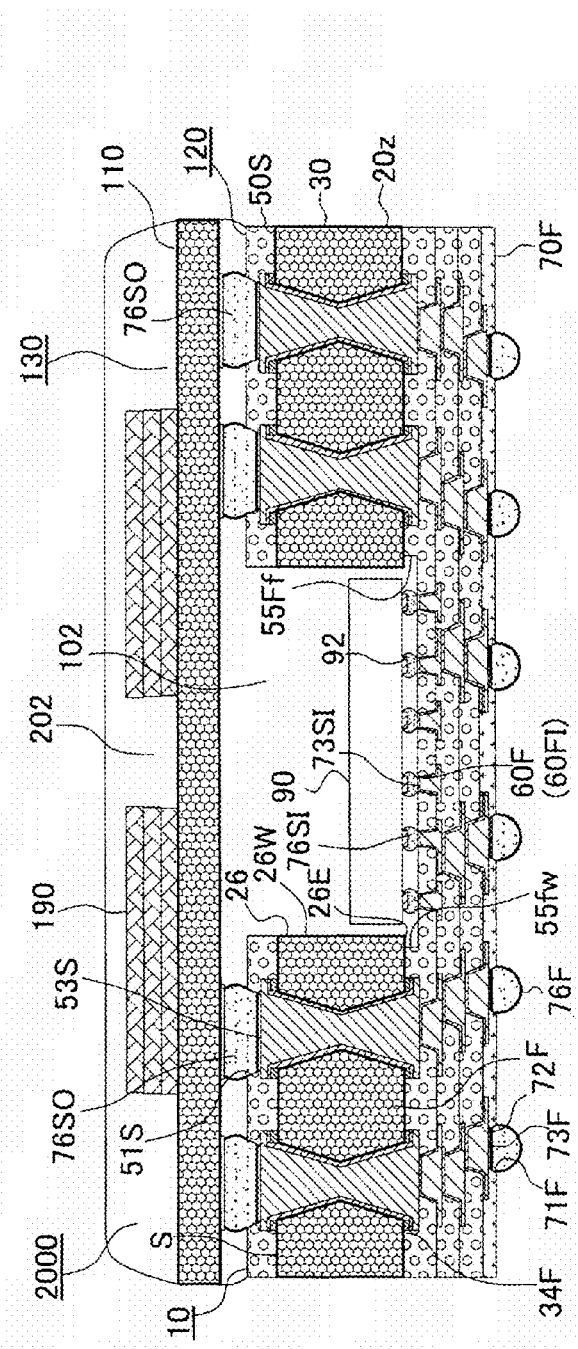
FIG. 2A
FIG. 2B

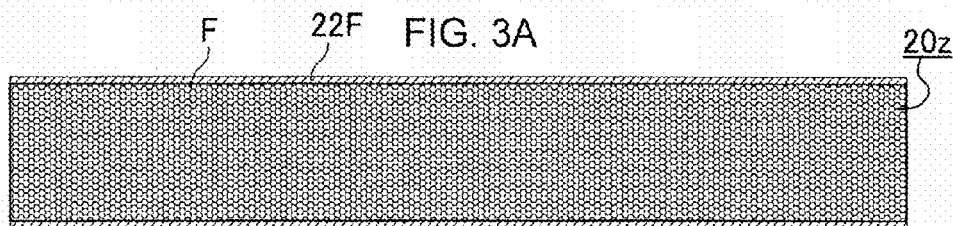
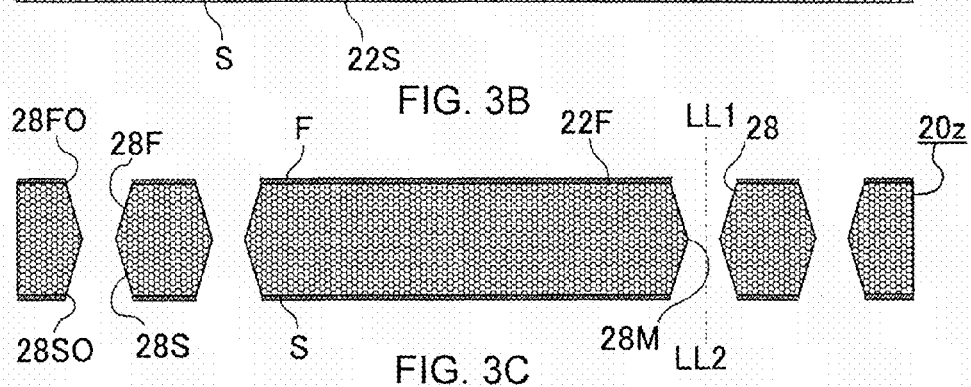
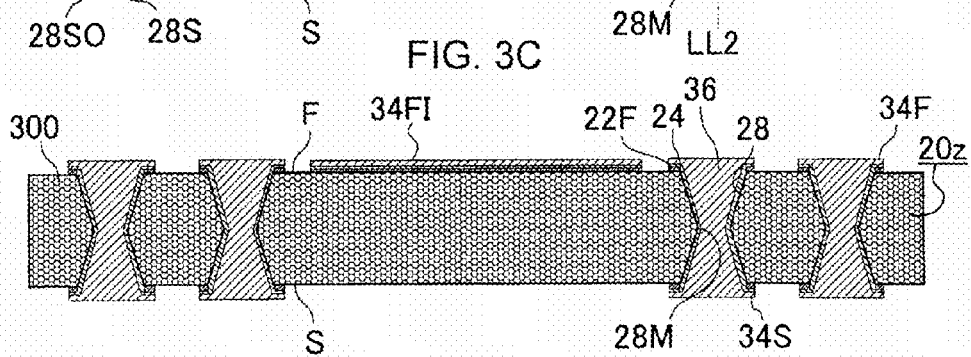
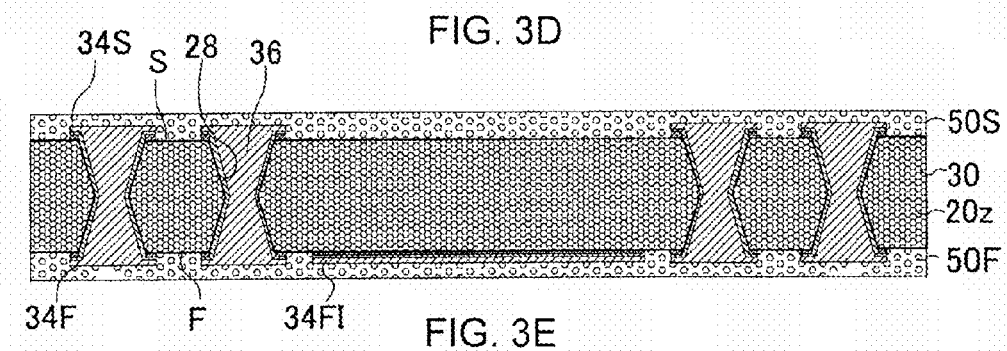
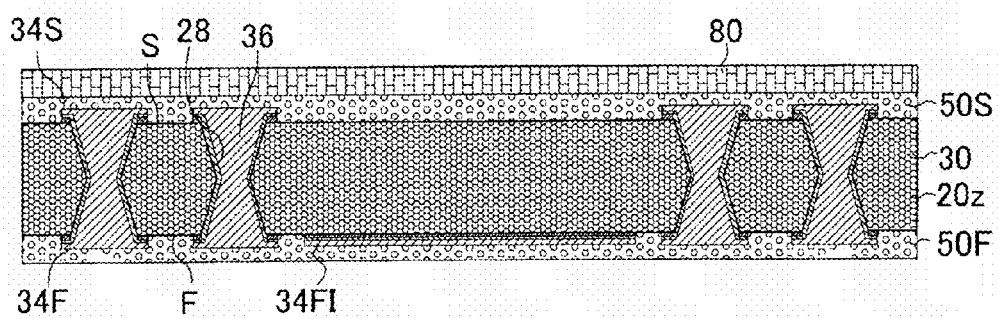

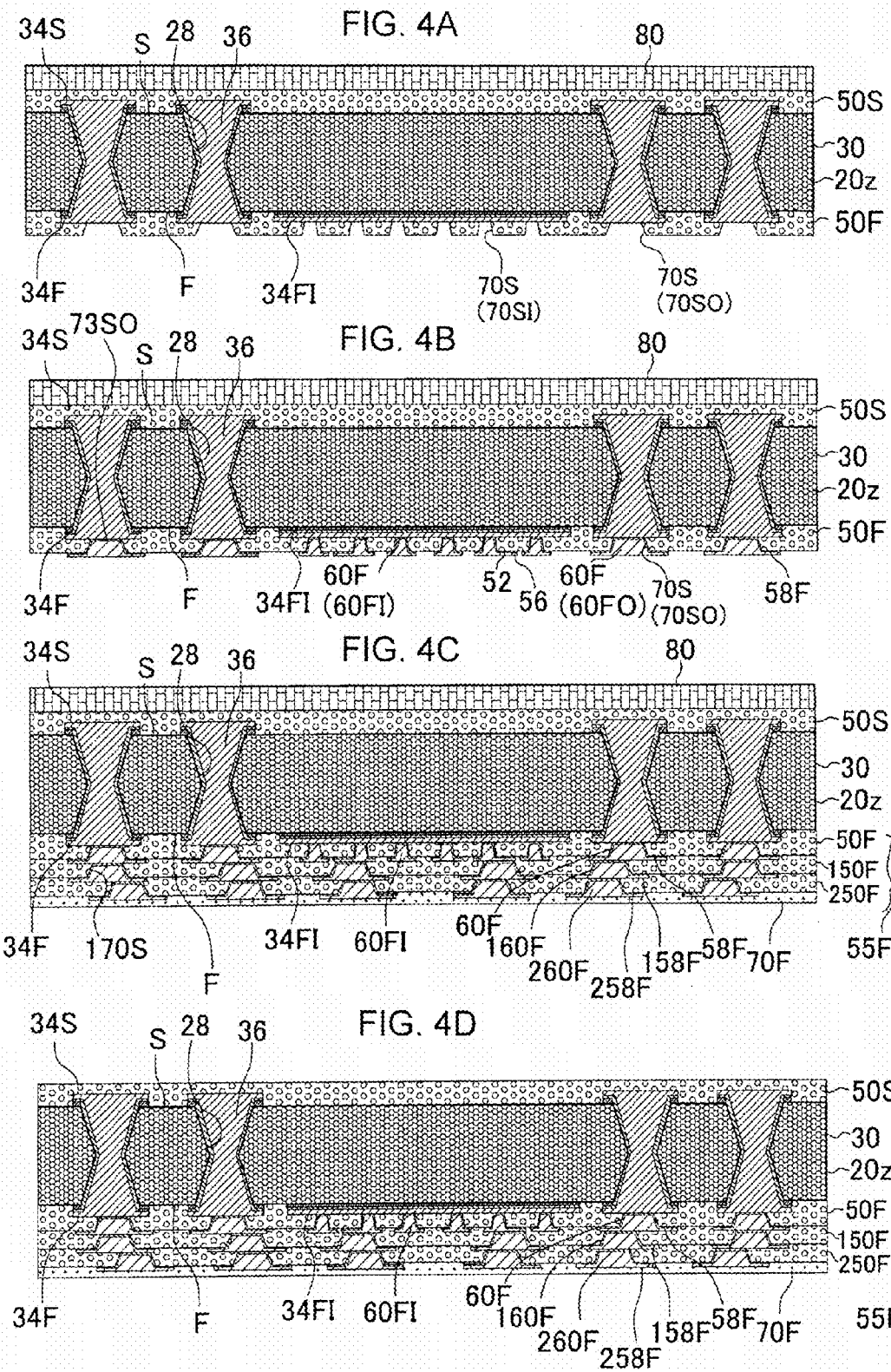

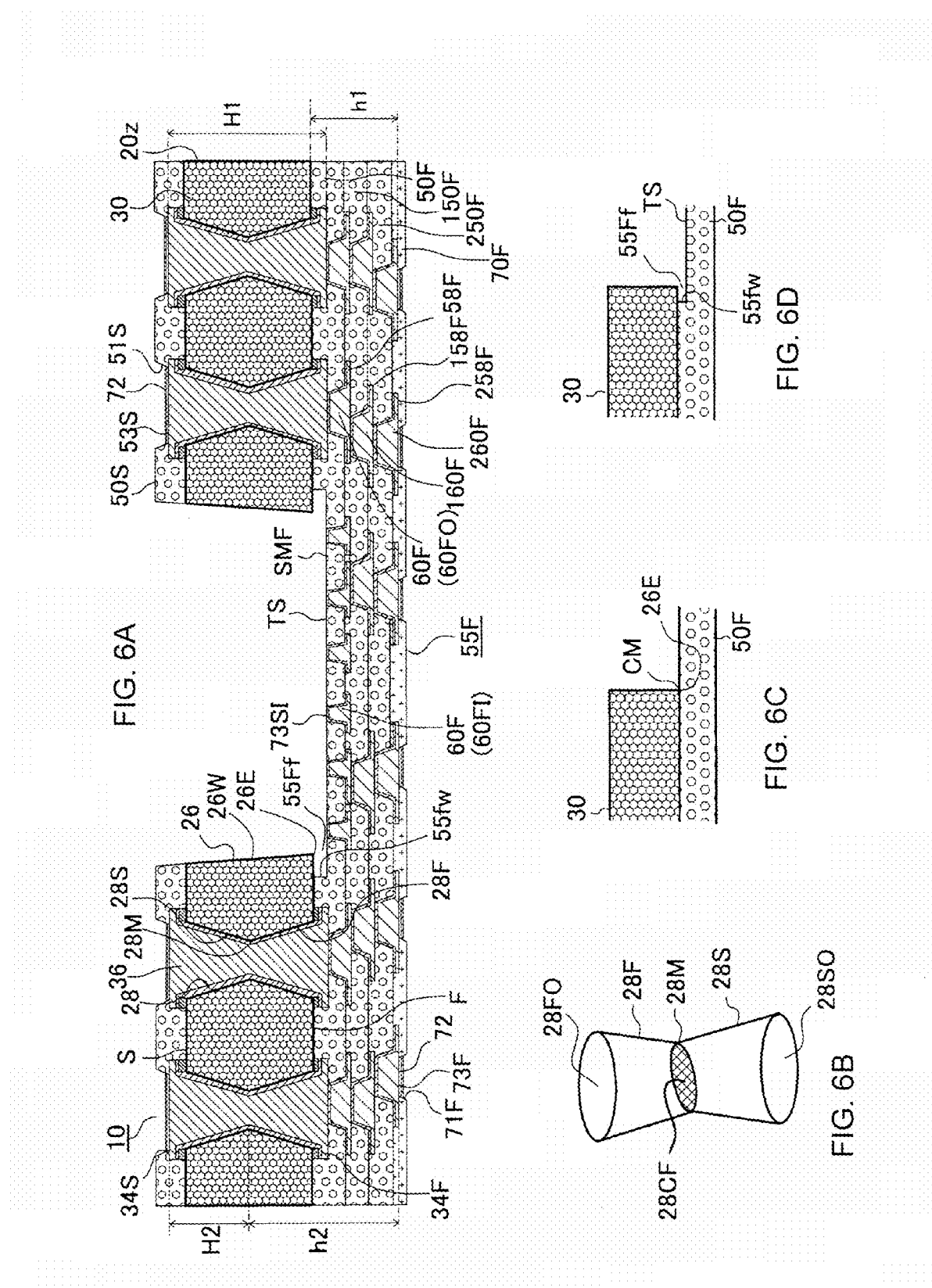

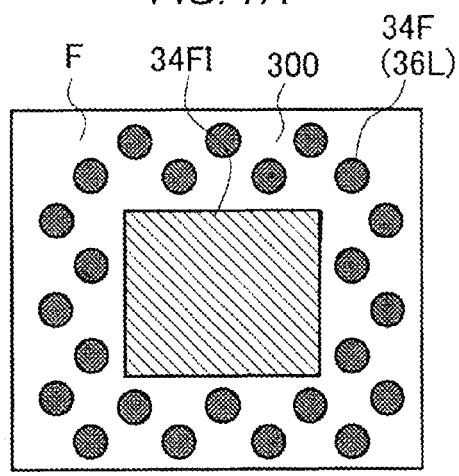
FIG. 7A
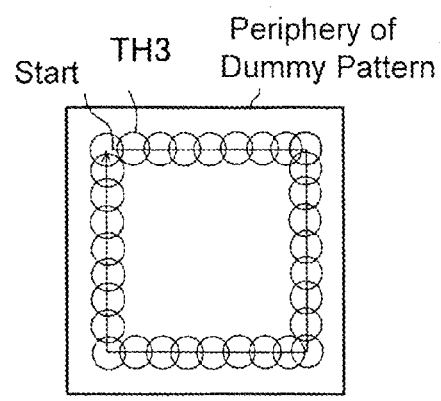
FIG. 7C
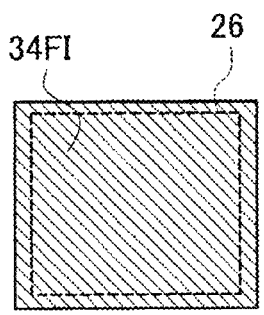
FIG. 7B
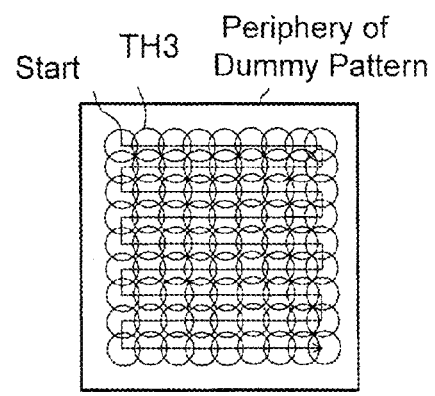
FIG. 7D
FIG. 7E
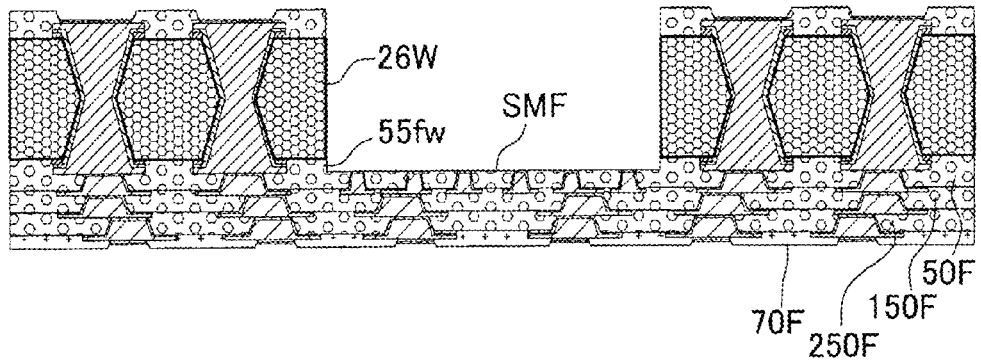

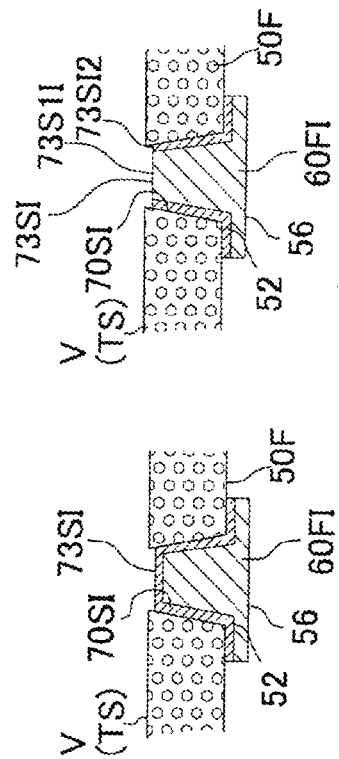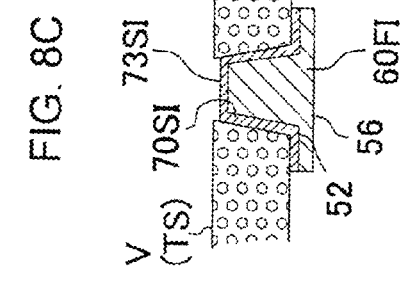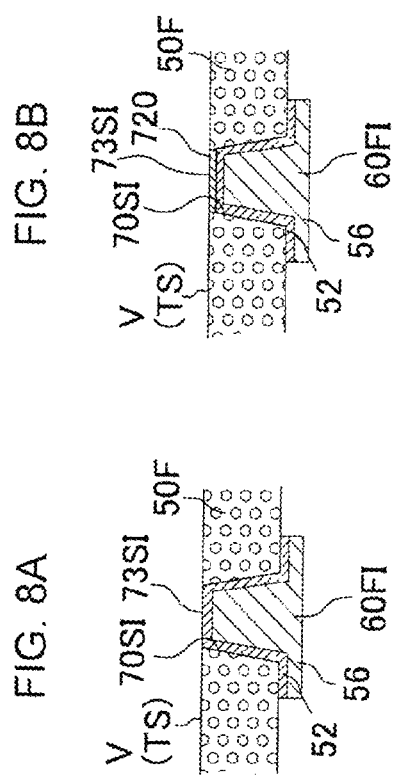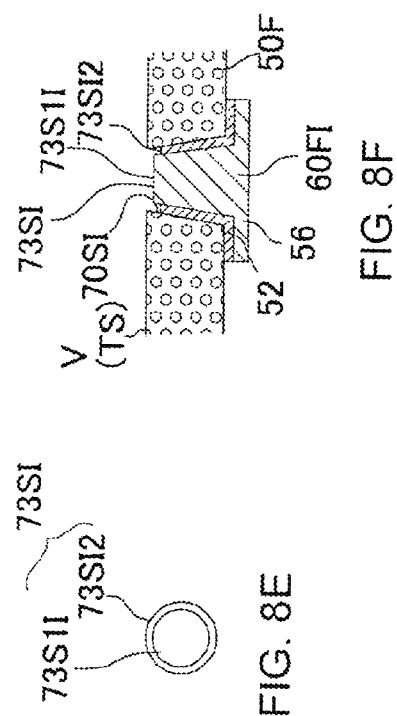

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2014-124044, filed Jun. 17, 2014, the entire contents of which are incorporated herein by reference.

BACKGROUND OF THE INVENTION

Field of the Invention

The present invention relates to a printed wiring board made up of a second circuit board having a mounting area and a first circuit board having an opening to expose the mounting area of the second circuit board. The present invention also relates to a method for manufacturing such a printed wiring board.

Description of Background Art

JP2007-123524A describes a wiring board with a built-in electronic component. According to JP2007-123524A, the wiring board with a built-in electronic component has a coreless substrate and a resin layer. Through vias and an accommodation portion to accommodate a semiconductor chip are formed in the resin layer. The entire contents of this publication are incorporated herein by reference.

SUMMARY OF THE INVENTION

According to one aspect of the present invention, a printed wiring board includes a first circuit board having a first surface and a second surface on the opposite side with respect to the first surface, and a second circuit board having a third surface and a fourth surface on the opposite side with respect to the third surface and having a mounting area on the third surface of the second circuit board. The first circuit board is laminated on the third surface of the second circuit board such that the first surface of the first circuit board is in contact with the third surface of the second circuit board, the first circuit board includes reinforcing material and has an opening portion exposing the mounting area of the second circuit board, and the first circuit board and the second circuit board are formed such that a ratio H1/h1 is in a range that is greater than 0.75 and smaller than 2.4, where H1 represents a thickness of the first circuit board and h1 represents a thickness of the second circuit board.

According to one aspect of the present invention, a method for manufacturing a printed wiring board includes forming a first conductive layer on a first surface of an insulative substrate such that the first conductive layer includes a dummy pattern, forming a second conductive layer on a second surface of the insulative substrate on the opposite side with respect to the first surface of the insulative layer, forming a circuit board on the first surface of the insulative substrate such that a surface of the circuit board having a mounting area faces the dummy pattern of the first conductive layer on the first surface of the insulative substrate, forming an opening portion through the insulative substrate such that the opening portion exposes the dummy pattern of the first conductive layer, and removing the dummy pattern from the first conductive layer such that the mounting area on the surface of the circuit board is exposed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2A and 2B are cross-sectional views showing applied examples of the printed wiring board according to the embodiment;

FIG. 3A-3E are views of processes showing a method for manufacturing a printed wiring board according to the embodiment;

FIG. 4A-4D are views of processes showing the method for manufacturing a printed wiring board according to the embodiment;

FIG. 6A shows a cross-sectional view of a printed wiring board according to a modified example of the embodiment;

FIG. 6B is a schematic view showing a penetrating hole;

FIG. 6C is a view showing a contact point;

FIG. 6D is a view showing a recessed portion;

FIG. 7A is a plan view of an intermediate substrate;

FIG. 7B shows a dummy pattern;

FIG. 7C and FIG. 7D show methods for forming an opening;

FIG. 7E shows a second modified example of the embodiment; and

FIG. 8A-8F show examples of a mounting via and a first pad.

DETAILED DESCRIPTION OF THE EMBODIMENTS

Figures 1A, 1B:
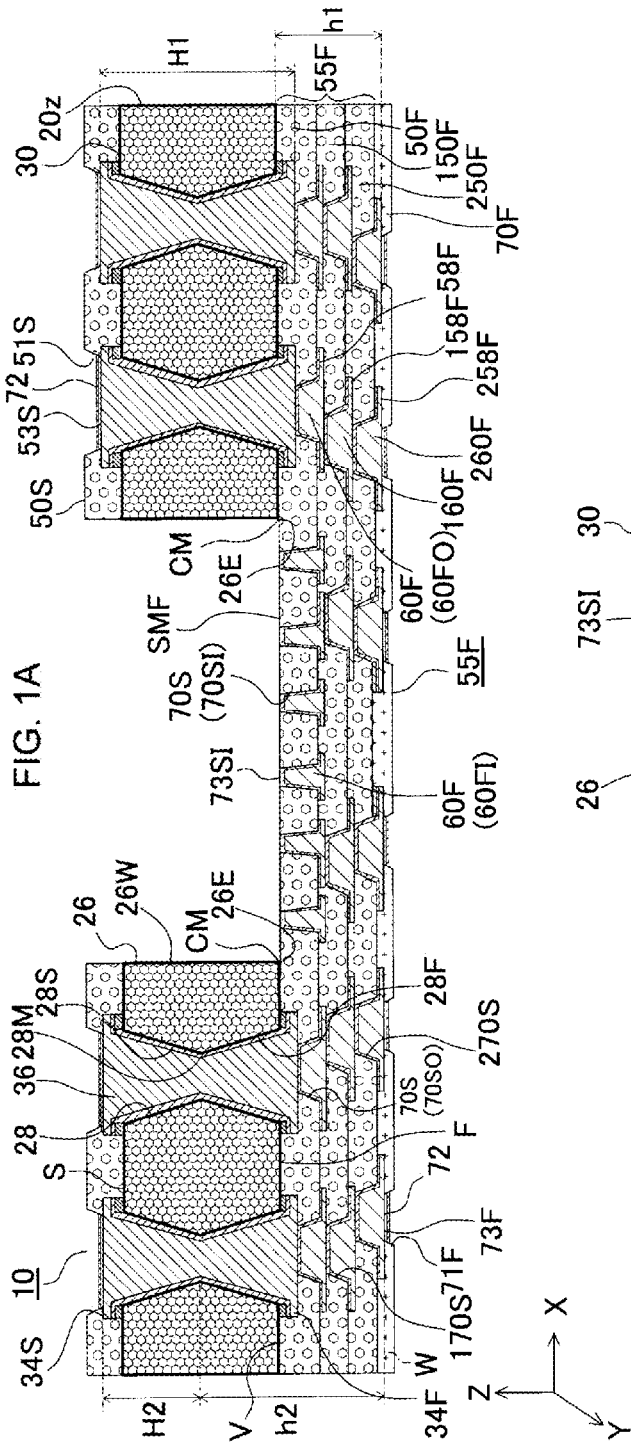
FIG. 1A is a cross-sectional view of a printed wiring board according to an embodiment of the present invention.
FIG. 1B is a plan view showing a first circuit board and a mounting area exposed in an opening of the first circuit board.

The embodiments will now be described with reference to the accompanying drawings, wherein like reference numerals designate corresponding or identical elements throughout the various drawings.

Embodiment

FIG. 1A shows printed wiring board 10 according to an embodiment of the present invention. Printed wiring board 10 of the embodiment includes first circuit board 30 having a first surface (F) and second surface (S) opposite the first surface, and second circuit board (55F) having third surface (V) and fourth surface (W) opposite the third surface.

Second circuit board (55F) shown in FIG. 1A is formed with conductive layers (58F, 158F, 258F) and resin insulation layers (50F, 150F, 250F) that are alternately laminated. Second circuit board (55F) is laminated on first surface (F) of first circuit board 30. Third surface (V) of the second circuit board faces first surface (F) of the first circuit board, and third surface (V) of the second circuit board is in contact with first surface (F) of the first circuit board.

Resin insulation layers of the second circuit board are made of resin and inorganic particles. Resin insulation layers (50F, 150F, 250F) may further contain reinforcing material such as glass cloth. When resin insulation layers (50F, 150F, 250F) contain reinforcing material, cracking is suppressed from occurring in the second circuit board. Resin insulation layers each have via-conductor openings, which taper from the fourth-surface (W) side toward the third-surface (V) side.

Via conductors (60F, 160F, 260F) are respectively formed in the openings of the resin insulation layers. The sidewall of each via conductor tapers from the fourth-surface (W) side toward the third-surface (V) side. Adjacent conductive layers are connected by via conductors.

On the approximate center of third surface (V), second circuit board (55F) has mounting area (SMF) shown in FIG. 1B. The mounting area is exposed by opening 26 of the first circuit board. Electronic components such as an IC chip will be mounted on the mounting area.

The first circuit board shown in FIG. 1A is made up of insulative substrate (20z) containing resin and reinforcing material, first conductive layer (34F), second conductive layer (34S) and through-hole conductors 36. The insulative substrate has first surface (F) and second surface (S) opposite first surface (F). The first surface of the insulative substrate corresponds to the first surface of the first circuit board, and the second surface of the insulative substrate corresponds to the second surface of the first circuit board. The insulative substrate may further contain inorganic particles. First conductive layer (34F) is formed on the first surface, and second conductive layer (34S) is formed on the second surface. The first and second conductive layers are connected to each other by through-hole conductors. The first circuit board further includes opening 26 to expose mounting area (SMF) of the second circuit board. In FIG. 1A, there is no further conductive layer formed on the second conductive layer. In such a structure, the second conductive layer is the uppermost conductive layer.

As shown in FIG. 1A, first resin insulation layer (50F) is formed on first surface (F) of first circuit board 30 and on first conductive layer (34F). In first resin insulation layer (50F), openings (70S, 70SI, 70SO) for first via conductors (60F, 60FI, 60FO) are formed, penetrating through resin insulation layer (50F).

First conductive layer (58F) in the second circuit board is formed on first resin insulation layer (50F). First via conductors (60F) are formed in openings (70S) for first via conductors (60F). First via conductors (60F) include connection via conductors (60FO) to connect conductive layer (58F) (first conductive layer in the second circuit board) and first conductive layer (34F) as well as mounting via conductors (60FI) for mounting an electronic component. Connection via conductors (60FO) are each preferred to be directly connected to land (36L) of a through-hole conductor in the first circuit board. A land (36L) is included in the first conductive layer and is made of the conductor covering a through-hole conductor and the conductor surrounding the through-hole conductor.

Mounting via conductors are formed in mounting area (SMF). A mounting via conductor (60FI) is formed in a via-conductor opening (70SI) formed in resin insulation layer (50F). Bottom (73SI) (C4 pad) of a mounting via conductor (60FI) is exposed by opening (70SI). In addition, bottom (73SI) is exposed in opening 26 of the first circuit board. The bottom of a mounting via conductor (C4 pad) is exposed by opening 26 and opening (70SI).

A connection via conductor (60FO) is formed in opening (70SO) of resin insulation layer (50F). Bottom (73SO) of a connection via conductor (60FO) is directly connected to land (36L) of a through-hole conductor.

As shown in FIGS. 1 and 8, the bottom of mounting via conductor (60FI) that penetrates through resin insulation layer (50F) (first resin insulation layer) is exposed, and works as first pad (73SI) (C4 pad). The first pad is formed in the mounting area of the second circuit board.

Examples of first pad (73SI) and mounting via conductor (60FI) exposed through opening 26 of the first circuit board are shown below.

FIG. 8A shows a first example. In FIG. 8A, a mounting via conductor (60FI) is made up of seed layer 52 formed on the sidewall of a first via-conductor opening (70SI) and of electrolytic plated film 56 formed on seed layer 52. The seed layer 52 exposed in opening 26 forms the bottom of a mounting via conductor and works as a first pad. In the first example, the bottom is made flush with third surface (V) of resin insulation layer (50F) (first resin insulation layer).

FIG. 8B shows a second example. In FIG. 8B, a mounting via conductor is formed in a via-conductor opening (70SI) and is made up of metal film 720, seed layer 52 on metal film 720 and electrolytic plated film 56 on seed layer 52. Seed layer 52 is formed on metal film 720 and the sidewall of a via-conductor opening (70SI). The metal film 720 is exposed in opening 26 and forms the bottom of a mounting via conductor. In the second example, the bottom is made flush with third surface (V) of resin insulation layer (50F) (first resin insulation layer). The metal film works as a first pad. The metal film is for preventing oxidation of the pad, and is made of a film containing a metal such as Au, Sn and Pd.

FIG. 8C shows a third example. A mounting via conductor of the third example is made of a seed layer and electrolytic plated film on the seed layer, the same as in the first example. However, in the third example, the bottom is recessed from third surface (V) of resin insulation layer (50F) (first resin insulation layer). The seed layer works as a first pad in the third example. The bottom shown in the second example may also be recessed from the third surface of first resin insulation layer (50F), the same as in the third example.

FIGS. 8D and 8E show a fourth example. FIG. 8D is a cross-sectional view. FIG. 8E is a plan view, and shows bottom (73I) of a mounting via conductor in the fourth example. As shown in FIG. 8B, a mounting via conductor is made of seed layer 52 and electrolytic plated film 56 on the seed layer. The bottom of a mounting via conductor in the fourth example is recessed from the third surface. In the fourth example, the bottom of a mounting via conductor is made of electrolytic plated film 56 and seed layer 52 surrounding electrolytic plated film 56. The seed layer is formed on the sidewall of a first via-conductor opening. Electrolytic plated film 56 is formed on the seed layer. In the fourth example, seed layer (73I2) and electrolytic plated film (73I1), which form the bottom of a mounting via conductor, are made flush.

FIG. 8F shows a fifth example. A mounting via conductor of the fifth example is made of seed layer 52 and electrolytic plated film 56 on the seed layer. The bottom of a mounting via conductor in the fifth example is made of electrolytic plated film 56 and seed layer 52 surrounding electrolytic plated film 56. In addition, the bottom of a mounting via conductor in the fifth example is recessed from the third surface. Moreover, at the bottom of a mounting via conductor in the fifth example, the seed layer 52 at bottom (73SI2) is recessed from electrolytic plated film 56 at bottom (73SI1).

Solder bump (76SI) is formed on a first pad for connection with an electronic component. According to the fifth example, the surface area of a pad is made greater. Thus, connection reliability is high between a first pad and solder bump (76SI) on the first pad. When the bottom is recessed from the third surface of first resin insulation layer (50F), first resin insulation layer (50F) works as a dam so that insulation reliability is enhanced between solder bumps (76SI) on the first pads. An example of electrolytic plated film 56 is electrolytic copper-plated film and an example of a seed layer is electroless copper-plated film.

In JP2007-123524A, a pad for mounting an electronic component is made of the land of a via conductor formed on a resin insulation layer. The land protrudes from the resin insulation layer and is not embedded in the resin insulation layer. A land that forms a pad in JP2007-123524A covers the via conductor. In addition, the size of a land that forms a pad in JP2007-123524A is set greater than the size of the via conductor. By contrast, in the present embodiment, pad (73SI) (first pad) for mounting electronic component 90 is the bottom of a mounting via conductor (60FI). A first pad in the printed wiring board according to the embodiment does not have a land for mounting an electronic component. According to the present embodiment, the size of a pad for mounting an electronic component is made smaller. Subsequently, the pitch of pads is narrower. According to the embodiment, the size of a printed wiring board is reduced, and the degree of warping is smaller in the printed wiring board. Connection reliability is enhanced between the printed wiring board and the electronic component. A printed wiring board capable of mounting an electronic component at high yield is provided.

In the printed wiring board of the embodiment, a first via-conductor opening tapers from the lower surface toward the upper surface of a resin insulation layer. Thus, the size of a pad is even made smaller, and the pitch of first pads is further narrowed. The size of a printed wiring board is made smaller. A high-functional electronic component can be mounted on the printed wiring board.

As shown in FIG. 1A, second resin insulation layer (150F) is formed on resin insulation layer (50F) and conductive layer (58F). In second resin insulation layer (150F), openings (170S) for second via conductors (160F) are formed, penetrating through resin insulation layer (150F).

Second conductive layer (158F) in the second circuit board is formed on second resin insulation layer (150F). Second via conductors (160F) are formed in openings (170S) for second via conductors (160F). Second via conductors (160F) connect conductive layer (158F) (second conductive layer in the second circuit board) and conductive layer (58F) to each other.

Third resin insulation layer (250F) is formed on resin insulation layer (150F) and conductive layer (158F). In third resin insulation layer (250F), openings (270S) for third via conductors (260F) are formed, penetrating through resin insulation layer (250F).

Third conductive layer (258F) in the second circuit board is formed on third resin insulation layer (250F). Third via conductors (260F) are formed in third via-conductor openings (270S). Third via conductors (260F) connect conductive layer (258F) (third conductive layer in the second circuit board) and conductive layer (158F) to each other. Third conductive layer (258F) is the lowermost conductive layer of printed wiring board 10.

The printed wiring board may include solder-resist layer (70F) (lower solder-resist layer) on resin insulation layer (250F) (lowermost resin insulation layer) and on conductive layer (258F) (lowermost conductive layer) of the second circuit board. Openings (71F) to expose portions of conductive layer (258F) (lowermost conductive layer) are formed in solder-resist layer (70F). Conductive layer (258F) exposed in openings (71F) work as pads (73F) for connection with a motherboard.

Protective film 72 may be formed on pads (73F). The protective film is for preventing oxidation of pads. Protective film is formed using, for example, Ni/Au, Ni/Pd/Au, Pd/Au, or OSP (organic solderability preservative).

The protective film may be formed on the bottoms (C4pads) of mounting via conductors (60FI).

As shown in FIG. 3B, penetrating holes 28 are made up of first opening portion (28F) having first opening (28FO) on first surface (F) of insulative substrate (20z) and second opening portion (28S) having second opening (28SO) on second surface (S). A penetrating hole 28 has a connection plane, and the first and second opening portions are joined at connection plane (28CF). Connection plane (28CF) is shown in FIG. 6B. Diagonal lines are drawn on connection plane (28CF). Connection portion (28M) is the point where the sidewall of the first opening portion intersects the sidewall of the second opening portion. The size of the connection plane is preferred to be smaller than that of the first opening, and the size of the connection plane is also preferred to be smaller than that of the second opening. First opening portion (28F) is preferred to taper from the first surface toward the second surface. Second opening portion (28S) is preferred to taper from the second surface toward the first surface. Through-hole conductor 36 is formed in penetrating hole 28 having such a shape. Through-hole conductors shown in FIG. 1A may be formed by a method described in U.S. Pat. No. 7,786,390, for example. The contents of U.S. Pat. No. 7,786,390 are incorporated herein by reference. Conductive layers (34F, 34S) of first circuit board 30 include multiple conductive circuits (not shown) and lands (36L) surrounding through-hole conductors 36.

As shown in FIGS. 1A and 6A, opening 26 exposes mounting area (SMF) of the second circuit board. Opening 26 exposes the bottoms of via conductors (60FI) (mounting via conductors) that penetrate through resin insulation layer (50F) and is in contact with the first circuit board.

A modified example of the embodiment is shown in FIG. 6A. In the printed wiring board of the modified example, opening 26 tapers from second surface (S) toward first surface (F). Sidewall (26W) of the first circuit board exposed in opening 26 tapers from second surface (S) toward first surface (F). On the other hand, via-conductor openings formed in the second circuit board taper from the fourth-surface side toward the third-surface side. Via-conductor openings formed in each resin insulation layer taper from the lower surface toward the upper surface. The openings formed in the second circuit board and the opening formed in the first circuit board taper in opposite directions from each other. Because openings taper in opposite directions, warping in the second circuit board is offset by warping in the first circuit board. Accordingly, the degree of warping is smaller in the printed wiring board made up of such first and second circuit boards.

Insulative substrate (20z) is made of reinforcing material and resin. Insulative substrate (20z) may further contain inorganic particles. Examples of reinforcing material are glass fibers, glass cloth and aramid fibers. Examples of inorganic particles are silica and alumina particles. The resin layers in JP2007-123524A do not include reinforcing material. By contrast, since insulative substrate (20z) of first circuit board 30 contains reinforcing material, the strength and rigidity of the first circuit board are high. The degree of warping is smaller in the printed wiring board of the embodiment. According to the embodiment, warping caused by heat cycles is less. Thus, at contact point (CM) connecting the second circuit board and corner portion (26E) of the first circuit board, stress is low. Cracking originating at the contact point is less likely to occur in the second circuit board. Contact point (CM) and corner portion (26E) are shown in FIGS. 1A and 6C.

The printed wiring board may have solder-resist layer (50S) (upper solder-resist layer) on second surface (S) of first circuit board 30 and on second conductive layer (34S). Openings (51S) to expose portions of second conductive layer (34S) are formed in solder-resist layer (50S). Portions of second conductive layer (34S) exposed by openings (51S) work as pads (53S) (second pads) for mounting second package substrate 130. Protective film 72 may be formed on second pads. Second package substrate 130 is shown in FIG. 2B.

The printed wiring board of the present embodiment has thickness (H1) of the first circuit board and thickness (h1) of the second circuit board. As shown in FIG. 1A, thickness (H1) is the distance between the upper surface of first conductive layer (34F) and the upper surface of second conductive layer (34S). Thickness (h1) is the distance between third surface (V) of the first resin insulation layer and the upper surface of the lowermost conductive layer (258F), or the distance between first surface (F) of the first circuit board and the lowermost conductive layer (258F). The ratio (H1/h1) is set greater than 0.75 but smaller than 2.4.

Axes (X, Y, Z) are shown in FIG. 1A. Axes (X, Y) are parallel to the first surface of the first circuit board, and axis (Z) is perpendicular to the first surface of the circuit board.

Since insulative substrate (20z) contains reinforcing material, the strength and rigidity of the first circuit board in directions (X-Y) is high. However, since the thermal expansion coefficient in direction (Z) of the insulative substrate is high, the degree of expansion/contraction of the first circuit board in direction (Z) is high during heat cycles. As a result, if a ratio (H1/h1) is high, cracking originating at contact point (CM) tends to occur in the second circuit board due to the expansion/contraction of the first circuit board in direction (Z). Therefore, the ratio (H1/h1) is set lower than 2.4.

When insulative substrate (20z) is set thinner, strength and rigidity are lowered in a printed wiring board. Thus, the printed wiring board repeats convex warping and concave warping during heat cycles. Stress caused by warping is thought to concentrate on contact point (CM). As a result, if a ratio (H1/h1) is low, cracking originating at contact point (CM) caused by warping tends to occur in the second circuit board. Therefore, the ratio (H1/h1) is set higher than 0.75.

In JP2007-123524A, penetrating holes are formed in the resin layers. The penetrating holes in JP2007-123524A are shaped straight. By contrast, penetrating holes formed in the first circuit board of the embodiment each have connection portion (28M). Since the connection portion is a point of change, connection portion (28M) tends to receive stress. Thus, stress is thought to be dispersed among contact point (CM) and connection portion (28M) in the embodiment. Accordingly, cracking originating at contact point (CM) is less likely to occur in the second circuit board. Metal plated film is formed on connection plane (28CF). Metal is more resistant to stress than resin. Thus, even if stress concentrates on connection plane (28CF), cracking originating at connection portion (28M) or connection plane (28CF) is less likely to occur in through-hole conductors. Since insulative substrate (20z) contains reinforcing material, cracking is less likely to occur in the first circuit board.

By contrast, the wiring board with a built-in electronic component shown in JP2007-123524A does not have connection portion (28M). Accordingly, stress is thought to concentrate only where corners of the resin insulation layer make contact with the coreless substrate. Cracking originating at the contact point tends to occur in the coreless substrate.

FIG. 2A shows first applied example 120 of printed wiring board 10 according to the present embodiment. First applied example 120 is a package substrate (first package substrate).

In package substrate 120, electronic component 90 such as an IC chip is accommodated in opening 26 of first circuit board 30. IC chip 90 is mounted through solder bumps (76SI) on C4 pads (73SI) exposed in opening 26.

FIG. 2B shows second applied example (POP board) 2000 of printed wiring board 10 according to the embodiment. In the second applied example, second package substrate 130 is mounted through connector members (76SO) on first package substrate 120. Second package substrate 130 has upper substrate 110 and electronic component 190 such as a memory mounted on the upper substrate. A connector member (76SO) is formed on second conductive layer (53S) (second pad) exposed in opening (51S) of upper solder-resist layer (50S). Connector member (76SO) corresponds to solder bump (76SO) in FIG. 2B. Other than solder bumps, examples of connector members are metal posts such as plating posts and pins. Plating posts and pins are formed in a cylindrical shape. A right circular cylinder is preferred. Molding resin 102 is formed between first package substrate 120 and second package substrate 130. Molding resin 202 is formed to encapsulate electronic component 190 on upper substrate 110.

The first circuit board may have a resin insulation layer and a conductive layer alternately laminated on the second surface of insulative substrate (20z) and the second conductive layer. In such a structure, upper solder-resist layer (50S) is formed on the resin insulation layer and the conductive layer. In such a case, the conductive layer directly underneath solder-resist layer (50S) is the uppermost conductive layer.

On pads (73F) exposed in openings (71F) of lower solder-resist layer (70F), printed wiring board 10 may have solder bumps (76F) for connection with a motherboard.

Figure 5A:
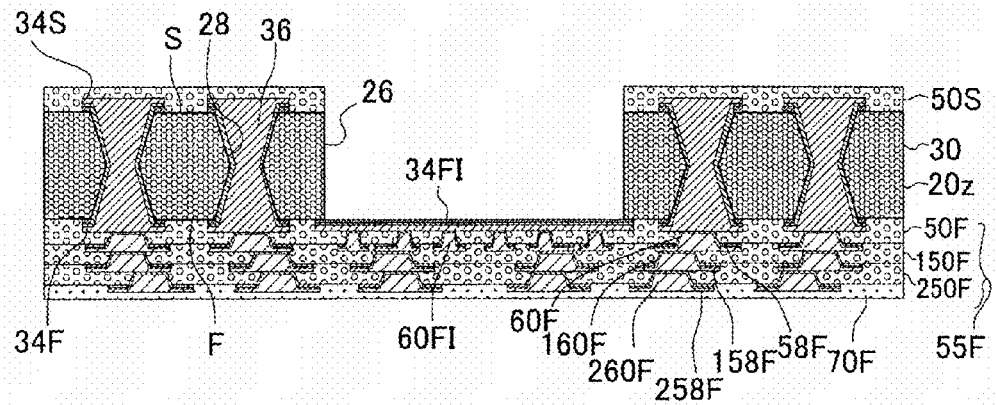
FIG. 5A-5C are views of processes showing the method for manufacturing a printed wiring board according to the embodiment.
Figure 5B:
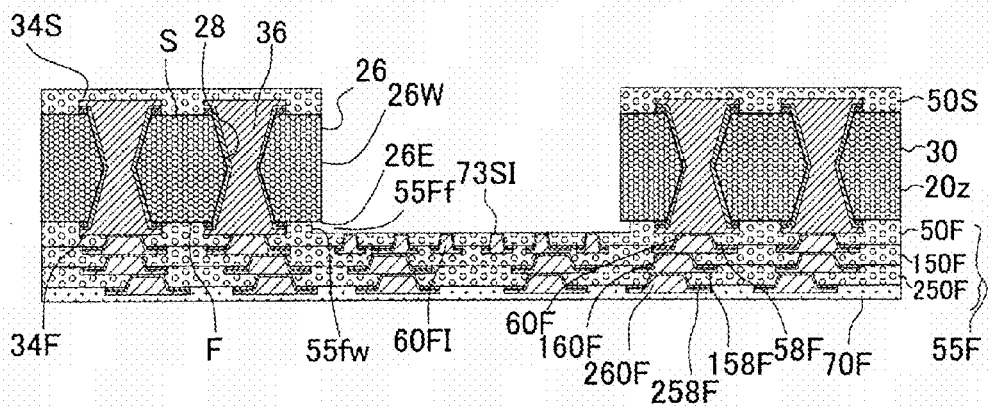
Figure 5C:
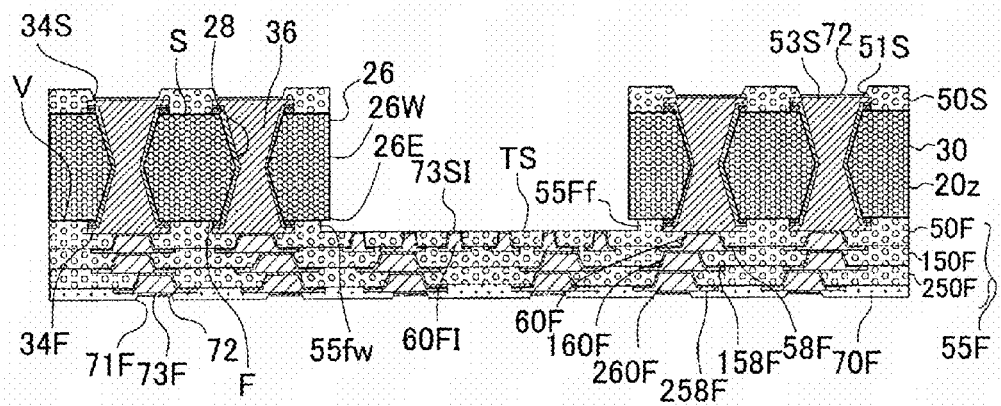

In the printed wiring board of the embodiment, opening 26 for accommodating an electronic component is formed in insulative substrate (20z). If a second circuit board is formed on each of both surfaces of the first circuit board, a symmetrical structure is obtained with the first circuit board at the center, and stress exerted on contact point (CM) is reduced. However, in the printed wiring board of the embodiment, a second circuit board is formed only on the first surface of the first circuit board. Thus, to prevent concentration of stress, recessed portion (55Ff) may be formed in the printed wiring board of the embodiment. FIGS. 6D and 5C show a printed wiring board with recessed portion (55Ff) (first modified example of the printed wiring board of the embodiment). Recessed portion (55Ff) is the space formed between first circuit board 30 and second circuit board (55F), and is connected to opening 26. The upper surface of the recessed portion corresponds to the first surface of the first circuit board, and the lower surface of the recessed portion corresponds to the third surface of the second circuit board. Sidewall (55fw) of the recessed portion corresponds to the side surface of resin insulation layer (50F) that is in contact with the first circuit board. Sidewall (55fw) of recessed portion (55Ff) is receded from sidewall (26W) of insulative substrate (20z) exposed by opening 26. Because of recessed portion (55Ff), highly rigid corner portion (26E) of first circuit board 30 does not touch the second circuit board. Even when stress generated by thermal expansion/contraction concentrates on corner portion (26E), stress from the corner portion does not reach the second circuit board. Cracking is less likely to occur in the second circuit board. When a printed wiring board has recessed portion (55Ff), reliability does not decrease. In the printed wiring board of the first modified example, third surface (TS) of the second circuit board exposed in opening 26 may be recessed from the first surface of the first circuit board. In such a structure, third surface (TS) exposed in opening 26 is positioned lower than the first surface of the first circuit board. The lower surface of recessed portion (55Ff) (upper surface of resin insulation layer (50F) in the recessed portion) is connected to third surface (TS) exposed in opening 26. The lower surface of the recessed portion is made flush with third surface (TS). In the printed wiring board having recessed portion (55Ff), the upper surface of resin insulation layer (50F) is made up of surface (V) that is in contact with the first circuit board, surface (TS) exposed in opening 26, and sidewall (55fw) connecting surface (V) and surface (TS). Sidewall (55fw) is formed because surface (V) and surface (TS) are not positioned on the same plane. Sidewall (55fw) is the surface exposed in recessed portion (55Ff). When a printed wiring board has surface (TS), distance (D1) is reduced. Thickness (D2) of the printed wiring board is reduced.

As shown in FIG. 1A, printed wiring board 10 includes thickness (H2) and thickness (h2). Thickness (H2) is the distance between the upper surface of second conductive layer (34S) of the first circuit board and the gravity center of a connection plane, or thickness (H2) is the distance between the upper surface of the uppermost conductive layer and the gravity center of the connection plane. Distance (h2) is the distance between the upper surface of the lowermost conductive layer (258F) and the gravity center of the connection plane. Distances (H2, h2) are measured using a penetrating hole for a through-hole conductor that is the closest to the point where two diagonal lines of a printed wiring board intersect each other and another penetrating hole for a through-hole conductor that is the closest to each of four corners of the printed wiring board. Then, the average value of five distances (H2) is used as distance (H2) of the printed wiring board, and the average value of five distances (h2) is used as distance (h2) of the printed wiring board. When the ratio (H2/h2) is within a predetermined value, stress exerted on the connection plane is lowered. The degree of warping caused by thermal stress is smaller in the printed wiring board.

The ratio (H1/h1) is greater than 0.75 but smaller than 2.4. The ratio (H2/h2) is greater than 0.35 but smaller than 0.7. The degree of warping of the printed wiring board is made smaller.

In JP2007-123524A, the lands that make pads for mounting an electronic component are formed on the resin insulation layer through which their via conductors penetrate. By contrast, first pads of the embodiment are embedded in the resin insulation layer. When electronic components having the same thickness are mounted on JP2007-123524A and the embodiment respectively, and when distance (D1) from the first surface of the first circuit board to the upper surface of the electronic component is compared in JP2007-123524A and in the embodiment, the distance (D1) in the embodiment is smaller than the distance in JP2007-123524A. Thickness (D2) of a printed wiring board is made smaller according to the embodiment. The distance (D1) in JP2007-123524A corresponds to the distance between the upper surface (28A) of the prepreg resin layer 28 (shown in FIG. 2 of JP2007-123524A) and the surface (14B) of the semiconductor chip 14.

Method for Manufacturing Printed Wiring Board of the Embodiment

FIG. 3~5 show a method for manufacturing printed wiring board 10 of the embodiment.

A starting substrate is prepared. A starting substrate is formed with insulative substrate (20z) and copper foils (22F, 22S) laminated respectively on both surfaces of insulative substrate (20z) (FIG. 3A). The insulative substrate contains reinforcing material, resin and inorganic particles. Examples of reinforcing material are glass cloth, glass fibers and aramid fibers. Examples of the resin are epoxy resin and bismaleimide triazine (BT) resin. The insulative resin has first surface (F) and second surface (S) opposite the first surface. Copper foil (22F) laminated on first surface (F) of the insulative substrate is first copper foil, and copper foil (22S) laminated on second surface (S) of the insulative substrate is second copper foil.

A CO2 laser is irradiated at first copper foil (22F) of the starting substrate. First opening portion (28F) is formed on the first-surface (F) side of insulative substrate (20z). A CO2 laser is further irradiated at second copper foil (22S). Second opening portion (28S) is formed on the second surface (S) side to be connected to first opening portion (28F). First opening portion (28F) and second opening portion (28S) are connected at connection plane (28CF). Connection plane (28CF) is shown in FIG. 6B. Connection portion (28M) is formed where the sidewall of the first opening portion intersects with the sidewall of the second opening portion. The laser is irradiated so that axis (LL1) of the first opening portion corresponds to axis (LL2) of the second opening portion. Penetrating hole 28 for a through-hole conductor is formed (FIG. 3B). The first opening portion tapers from first surface (F) toward second surface (S), whereas the second opening portion tapers from second surface (S) toward the first surface (F). The first opening portion has first opening (28FO) on the first surface, and the second opening portion has second opening (28SO) on the second surface.

Electroless plated film is formed on first and second copper foils and on the sidewall of penetrating hole 28. Then, electrolytic plated film is formed on the electroless plated film. Plated film 24 is formed in the penetrating hole, being made of electroless plated film and electrolytic plated film on the electroless plated film. Simultaneously, plated film 24 is formed on the first and second surfaces of the insulative substrate. Penetrating hole 28 is filled with electrolytic plated film. Etching resist is formed on plated film 24. Plated film 24 and copper foils (22F, 22S) exposed from the etching resist are removed. The etching resist is removed. First conductive layer (34F) is formed on the first surface of the insulative substrate, and second conductive layer (34S) is formed on the second surface of the insulative substrate. First conductive layer (34F) includes dummy pattern (34FI) for forming opening 26. Through-hole conductor 36 is formed in penetrating hole 28 and connects the first conductive layer and the second conductive layer. A through-hole conductor has its narrowest portion at connection portion (28M) of the penetrating hole. Intermediate substrate 300 is obtained, being formed with an insulative substrate having penetrating hole 28, through-hole conductor 36 formed in penetrating hole 28, first conductive layer (34F) formed on the first surface of the insulative substrate, and second conductive layer (34S) formed on the second surface of the insulative substrate (FIG. 3C). Intermediate substrate 300 may be manufactured by a method described in U.S. Pat. No. 7,786,390. The intermediate substrate has a first surface and a second surface. The first surface of the intermediate substrate corresponds to the first surface of the insulative substrate, and the second surface of the intermediate substrate corresponds to the second surface of the insulative substrate.

FIG. 7A shows a plan view of intermediate substrate 300. FIG. 7A is obtained by observing the intermediate substrate from the first-conductive-layer side. FIG. 7A shows the first conductive layer and the first surface of insulative substrate (20z) exposed through the first conductive layer. At an approximate center of the first surface of the insulative substrate, dummy pattern (34FI) is formed. Diagonal lines are drawn in dummy pattern (34FI). Dummy pattern (34FI) covers a predetermined region on the first surface of insulative substrate (20z). Dummy pattern (34FI) is a so-called solid pattern. Around the dummy pattern, lands (36L) of through-hole conductors 36 are shown. Diagonal lines in two different angles are drawn in lands (36L). FIG. 7B shows the positional relationship and sizes of opening 26 and dummy pattern (34FI).

The periphery of dummy pattern (34FI) is shown by solid lines, and the periphery of opening 26 is shown by dotted lines. The dotted lines indicate the periphery of opening 26 to be formed on the dummy pattern. As shown in FIG. 7B, the size of dummy pattern (34FI) is greater than the size of opening 26. In addition, the periphery of dummy pattern (34FI) is positioned on the outer side of the periphery of opening 26.

First resin insulation layer (50F) is formed through hot pressing on first surface (F) of intermediate substrate 300. Resin insulation layer (50S) (upper solder-resist layer) is formed on second surface (S) of the intermediate substrate (FIG. 3D). First resin insulation layer (50F) and upper solder-resist layer (50S) are made of a thermosetting resin. Resin insulation layers (50F, 50S) contain resin such as epoxy resin and inorganic particles made of silica, for example. Resin insulation layers (50F, 50S) may further contain reinforcing material such as glass cloth.

PET film 80 is laminated on resin insulation layer (50S) (FIG. 3E).

Next, first via-conductor openings (70S, 70SI, 70SO) are formed in resin insulation layer (50F) to reach the first conductive layer (FIG. 4A). Via-conductor openings (70S) include opening (70SI) reaching dummy pattern (34FI) and opening (70SO) reaching the first conductive layer excluding the dummy pattern. Opening (70SI) is for forming a mounting via conductor, and opening (70SO) is for forming a connection via conductor. Opening (70SO) reaches, for example, land (36L) of a through-hole conductor. The land of a through-hole conductor is made up of the conductor formed directly on the through-hole conductor and the conductor formed around the through-hole conductor. Conductive layer (58F) is formed on resin insulation layer (50F) using a semi-additive method. Simultaneously, via conductors (60F) are formed in openings (70S) (FIG. 4B). First via conductor (60FO) (connection via conductor) is formed in opening (70SO) to be connected to a through-hole conductor. First via conductor (60FO) (mounting via conductor) to form a C4 pad is formed in opening (70SI). First via conductors (60F) each have a bottom. The bottom of a connection via conductor is in contact with land 36 of a through-hole conductor. The bottom of a mounting via conductor is formed on the dummy pattern. The bottom of a mounting via conductor is in contact with the dummy pattern.

Metal film may be formed on the dummy pattern exposed through opening (70SI). The metal film works as a C4 pad. A metal other than copper is used for forming metal film, and such metal film prevents oxidation of a C4 pad (first pad). Examples of metal film are gold, palladium, and tin. Nickel may also be formed between the metal film and a C4 pad.

Second resin insulation layer (150F) is formed through hot pressing on resin insulation layer (50F) and conductive layer (58F). Second via-conductor opening (170S) is formed in second resin insulation layer (150F). Second resin insulation layer (150F) is made of a thermosetting resin. Conductive layer (158F) is formed on second resin insulation layer (150F). Simultaneously, second via conductor (160F) is formed in a second via-conductor opening. Conductive layer (158F) and via conductor (160F) are formed using a semi-additive method.

Third resin insulation layer (250F), conductive layer (258F) and third via conductor (260F) are formed by the same methods as described in the above paragraphs. Third resin insulation layer (250F) is made of a thermosetting resin. Resin insulation layers (50F, 150F, 250F) in the second circuit board are thermosetting resins.

Lower solder-resist layer (70F) is formed on third resin insulation layer (250F) and conductive layer (258F) (FIG. 4C). Lower solder-resist layer (70F) is made of a photo-curing resin, and contains resin and inorganic particles. Lower solder-resist layer (70F) does not contain reinforcing material such as glass cloth.

Upper solder-resist layer (50S) is a thermosetting resin, and lower solder-resist layer (70F) is a photo-curing resin. Upper solder-resist layer (50S) contains reinforcing material, but lower solder-resist layer (70F) does not contain reinforcing material. Even if the amounts of resin differ on the first surface and on the second surface of the first circuit board, the imbalance in the resin amounts is mitigated. The degree of warping in the printed wiring board is reduced.

Film 80 is removed (FIG. 4D). Film 80 may also be removed after opening 26 is formed. In such a case, a laser is irradiated at the first circuit board through the film and the upper solder-resist layer.

FIGS. 7C and 7D are plan views, showing the second surface of the insulative substrate projected on the dummy pattern at the same magnification. FIG. 7D shows a method for forming opening 26. A laser is irradiated on the second surface of the insulative substrate through the upper solder resist layer. First, a laser is irradiated at the starting position in FIG. 7D. Laser beams penetrate through the insulative substrate and reach the dummy pattern. Then, laser irradiation positions move along the arrow shown in FIG. 7D so that the adjacent through holes overlap each other. The insulative substrate positioned on the dummy pattern is removed. Opening 26 is formed to expose the dummy pattern (FIG. 5A). In the method shown in FIG. 7D, opening 26 is formed by forming multiple through holes. By increasing the overlapping portions, the periphery of opening 26 is formed to be substantially straight. The dummy pattern exposed in opening 26 is etched away. The bottom of a first via conductor (60FI) that forms a C4 pad is exposed in opening 26 (FIG. 5B).

In the embodiment, the size of the dummy pattern is set greater than the size of opening 26. Then, the dummy pattern between the first circuit board and the second circuit board is removed. Thus, as shown in FIG. 5B, the mounting area is recessed from the first surface of the first circuit board. In addition, space (55Ff) (recessed portion) is formed between the first circuit board and the second circuit board.

FIG. 7C shows another method for forming an opening. In FIG. 7C, a laser is used to form a frame-shaped opening to reach the dummy pattern. An etching solution is filled in the frame opening so that the dummy pattern is dissolved. At that time, the dummy pattern sandwiched by the insulative substrate and the second circuit board is dissolved, and the insulative substrate in the frame opening is thereby peeled from the second circuit board. Accordingly, the insulative substrate in the frame opening is removed from the second circuit board. Opening 26 is formed and the bottom of a first via conductor (60FI) that forms a C4 pad is exposed therein (FIG. 5B).

By irradiating a laser on the PET film or the like laminated on resin insulation layer (50S), opening 26 is formed to penetrate through film 80, resin insulation layer (50S) and the first circuit board. After opening 26 is formed, film 80 is removed.

It is yet another option to form opening 26 by using a router.

When opening 26 is formed by the method shown in FIG. 7D, the dummy pattern made of copper is removed by etching. For example, when the bottom of a mounting via conductor is formed with metal film, dissolution of such a bottom is suppressed while the dummy pattern is etched away.

Using a laser, opening (51S) is formed in upper solder-resist layer (50S) to expose a pad (53S). In lower solder-resist layer (70F), opening (71F) to expose a pad (73F) is formed by exposure and development.

Protective film 72 is formed on pads (73F, 53S) and C4 pads (73SI) (FIG. 5C). Protective film is for preventing oxidation of pads. Protective film is formed using, for example, Ni/Au, Ni/Pd/Au, Pd/Au or OSP (organic solderability preservative). No protective film is formed on C4 pads.

Solder bumps (76F, 76SI, 76SO) are formed on pads (73F, 73SI, 53S) respectively.

Each resin insulation layer has an upper surface and a lower surface opposite the upper surface. The upper surface of each resin insulation layer is the surface closer to the first circuit board, and the lower surface of each resin insulation layer is the surface closer to the lower solder-resist layer. Via-conductor openings formed in each resin insulation layer taper from the lower surface toward the upper surface. Sidewalls of via conductors formed in via-conductor openings taper from the lower surface toward the upper surface as well. The via conductor has the bottom on its upper-surface side.

Conductive layers (58F, 158F, 258F) and via conductors (60F, 160F, 260F) are made of electroless copper-plated film 52 and electrolytic copper-plated film 56 on the electroless copper-plated film.

An IC chip is mounted on a printed wiring board through solder bumps (76SI) on C4 pads (73SI). A first package substrate (first applied example) is completed (FIG. 2A). The IC chip is accommodated in the opening. The IC chip does not protrude from opening 26. Second package substrate 130 is mounted on first package substrate 120 through solder bumps (76SO) (FIG. 2B). POP board 2000 (second applied example) is completed.

When the periphery of the dummy pattern corresponds to the periphery of opening 26 in the step shown in FIG. 5A, a printed wiring board without recessed portion (55Ff) is obtained (FIG. 7E). The printed wiring board shown in FIG. 7E is a second modified example. In FIG. 7E, sidewall (55*fw*) and sidewall (26W) of the first circuit board are positioned on substantially a straight line. FIG. 6C shows the contact point (CM) between the first circuit board and the second circuit board along with the first and second circuit boards near contact point (CM).

A first metal layer is formed on dummy pattern (34FI) exposed in opening (70SI), and a mounting via conductor (60FI) is formed on the first metal layer. When the material for the first metal layer is different from that for a mounting via conductor, the first metal layer can be selectively removed. The bottom of a mounting via conductor (60FI) is recessed from the third surface of resin insulation layer (50F). Metal film may be formed between the first metal layer and seed layer 52. In such a case, the metal film is exposed. The metal film is recessed from the third surface of the resin insulation layer. Metal film suppresses the oxidation of pads. Examples of metal film are Au, Sn and Pd films.

When the bottom of a mounting via conductor is recessed from the third surface, distance (D1) shown in FIG. 2A is reduced. Accordingly, thickness (D2) of the printed wiring board shown in FIG. 2A is made thinner.

On the dummy pattern exposed from opening (70SI), a mounting via conductor made of seed layer 52 and electrolytic plating 56 is formed. Metal film may be formed between the dummy pattern and the seed layer. By removing only the dummy pattern, the bottom of a mounting via conductor (60FI) is exposed. The bottom of a mounting via conductor formed with a seed layer is made flush with the third surface of the resin insulation layer (50F). The bottom of a mounting via conductor formed with metal film is made flush with the third surface of resin insulation layer (50F). By removing the seed layer, the electrolytic plated film of the mounting via conductor forms the bottom of the mounting via conductor. The bottom of a mounting via conductor is recessed from the third surface of resin insulation layer (50F). When the etching rate of the seed layer is faster than the etching rate of the electrolytic plated film, the seed layer surrounding the electrolytic plated film is recessed from the electrolytic plated film. For example, when a seed layer is made of electroless copper-plated film, and an electrolytic plated film is made of electrolytic copper-plated film, the seed layer tends to be recessed from the electrolytic plated film.

A wiring board with a built-in electronic component may be formed with a coreless substrate and a resin layer having an accommodation portion to accommodate a semiconductor chip. The strength and rigidity in such a wiring board are thought to be low. When the temperature of such a wiring board with a built-in electronic component is raised by a reflow or the like, it is thought that the degree of warping increases and that it is difficult to mount an electronic component on the wiring board with a built-in electronic component. In addition, heat cycles are thought to cause a decrease in connection reliability between the wiring board with a built-in electronic component and the electronic component. Also, when such a wiring board with a built-in electronic component undergoes heat cycles, warping or the like is thought to cause concentration of stress at contact points between corners of the resin layer and the coreless substrate. Such stress is thought to cause defects such as cracking in the coreless substrate.

A printed wiring board according to an embodiment of the present invention has an opening to accommodate an electronic component and reduces the degree of warping. A printed wiring board according to an embodiment of the present invention provides high reliability. A method for manufacturing a printed wiring board according to an embodiment of the present invention has an opening to accommodate an electronic component.

A printed wiring board according to an embodiment of the present invention is formed with a second circuit board and a first circuit board: the second circuit board has a third surface with a mounting area and a fourth surface opposite the third surface, while the first circuit board, which is laminated on the third surface of the second circuit board, has an opening to expose the mounting area and contains a reinforcing material. The first circuit board is made up of an insulative substrate that has a first surface, a second surface opposite the first surface, penetrating holes for through-hole conductors penetrating from the first surface to the second surface, and the opening; a first conductive layer formed on the first surface of the insulative substrate; a second conductive layer formed on the second surface of the insulative substrate; and through-hole conductors formed in the penetrating holes and connecting the first conductive layer and the second conductive layer. The penetrating holes each have a first opening portion with a first opening on the first surface, a second opening portion with a second opening on the second surface, and a connection plane formed where the first opening portion is connected to the second opening portion. The first surface of the first circuit board is in contact with the third surface of the second circuit board. Thickness (H1) of the first circuit board and thickness (h1) of the second circuit board are set to have a ratio (H1/h1) that is greater than 0.75 but smaller than 2.4.

A method for manufacturing a printed wiring board according to an embodiment of the present invention is as follows: preparing an insulative substrate that has a first surface and a second surface opposite the first surface, and contains resin and reinforcing material; forming a second conductive layer on the second surface of the insulative substrate; on the first surface of the insulative substrate, forming a first conductive layer that includes a dummy pattern; on the first surface of the insulative substrate and on the first conductive layer, forming a second circuit board that has a third surface having a mounting area and a fourth surface opposite the third surface in such a way that the third surface faces the first surface; in the insulative substrate, forming an opening that penetrates through the insulative substrate and exposes the dummy pattern; and exposing the mounting area by removing the dummy pattern.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a first circuit board having a first surface and a second surface on an opposite side with respect to the first surface; and
   a second circuit board having a third surface and a fourth surface on an opposite side with respect to the third surface and having a mounting area on the third surface of the second circuit board,
   wherein the first circuit board is laminated on the third surface of the second circuit board such that the first surface of the first circuit board is in contact with the third surface of the second circuit board, the first circuit board comprises reinforcing material and has an opening portion exposing the mounting area of the second circuit board, and the first circuit board and the second circuit board are formed such that a ratio H1/h1 is in a range that is greater than 0.75 and smaller than 2.4, where H1 represents a thickness of the first circuit board and h1 represents a thickness of the second circuit board, the first circuit board comprises an insulative substrate, a first conductive layer formed on a first surface of the insulative substrate, a second conductive layer formed on a second surface of the insulative substrate, and a through-hole conductor formed in a penetrating hole extending from the first surface to the second surface of the insulative substrate such that the through-hole conductor is connecting the first conductive layer and the second conductive layer through the insulative substrate, the penetrating hole is formed through the insulative substrate such that the penetrating hole has a first opening portion having a first opening on the first surface of the insulative substrate and a second opening portion having a second opening on the second surface of the insulative substrate and connected to the first opening portion to form a connection plane, the first opening portion is tapering from the first surface toward the second surface of the insulative substrate, and the second opening portion is tapering from the second surface toward the first surface of the insulative substrate, the first circuit board includes an outermost conductive layer, the second circuit board includes an outermost conductive layer, and the outermost conductive layers of the first and second circuit boards are formed such that a ratio H2/h2 is in a range that is greater than 0.35 and smaller than 0.7, where H2 represents a distance between the connection plane and an outer surface of the outermost conductive layer of the first circuit board, and h2 represents a distance between the connection plane and an outer surface of the outermost conductive layer of the second circuit board.

2. The printed wiring board according to claim 1, wherein the second circuit board comprises a first resin insulating layer having a plurality of first via openings extending from an upper surface to a lower surface of the insulating layer, a first inner conductive layer formed on the lower surface of the first resin insulating layer, and a plurality of first via conductors formed in the plurality of first via openings of the first resin insulating layer, respectively, the upper surface of the first resin insulating layer is forming the third surface of the second circuit board, and each of the first via conductors has a bottom portion exposed in the opening portion of the first circuit board such that the bottom portion of each of the first via conductors is forming a mounting pad positioned to mount an electronic component.

3. The printed wiring board according to claim 2, wherein each of the first via openings is tapering from the lower surface toward the upper surface of the first resin insulating layer such that each of the first via conductors is tapering from the lower surface toward the upper surface of the first resin insulating layer.

4. The printed wiring board according to claim 1, wherein the opening portion of the first circuit board is formed such that the opening portion is tapering from the second surface toward the first surface of the first circuit board.

5. The printed wiring board according to claim 2, wherein the bottom portion of each of the first via conductors is formed such that the bottom portion is recessed from the third surface of the second circuit board.

6. The printed wiring board according to claim 1, wherein the second circuit board has a recessed portion connected to the opening portion of the first circuit board.

7. The printed wiring board according to claim 2, wherein the opening portion of the first circuit board is formed such that the opening portion is tapering from the second surface toward the first surface of the first circuit board.

8. The printed wiring board according to claim 7, wherein each of the first via openings is tapering from the lower surface toward the upper surface of the first resin insulating layer such that each of the first via conductors is tapering from the lower surface toward the upper surface of the first resin insulating layer.

9. The printed wiring board according to claim 7, wherein the bottom portion of each of the first via conductors is formed such that the bottom portion is recessed from the third surface of the second circuit board.

10. The printed wiring board according to claim 8, wherein the bottom portion of each of the first via conductors is formed such that the bottom portion is recessed from the third surface of the second circuit board.

11. The printed wiring board according to claim 2, wherein the second circuit board has a recessed portion connected to the opening portion of the first circuit board.

12. The printed wiring board according to claim 11, wherein each of the first via openings is tapering from the lower surface toward the upper surface of the first resin insulating layer such that each of the first via conductors is tapering from the lower surface toward the upper surface of the first resin insulating layer.

13. The printed wiring board according to claim 11, wherein the bottom portion of each of the first via conductors is formed such that the bottom portion is recessed from the third surface of the second circuit board.

14. The printed wiring board according to claim 12, wherein the bottom portion of each of the first via conductors is formed such that the bottom portion is recessed from the third surface of the second circuit board.

15. The printed wiring board according to claim 1, wherein the insulative substrate of the first circuit board comprises resin and the reinforcing material.

16. The printed wiring board according to claim 15, wherein the second circuit board comprises a first resin insulating layer having a plurality of first via openings extending from an upper surface to a lower surface of the insulating layer, a first inner conductive layer formed on the lower surface of the first resin insulating layer, and a plurality of first via conductors formed in the plurality of first via openings of the first resin insulating layer, respectively, the upper surface of the first resin insulating layer is forming the third surface of the second circuit board, and each of the first via conductors has a bottom portion exposed in the opening portion of the first circuit board such that the bottom portion of each of the first via conductors is forming a mounting pad positioned to mount an electronic component.

17. The printed wiring board according to claim 16, wherein each of the first via openings is tapering from the lower surface toward the upper surface of the first resin insulating layer such that each of the first via conductors is tapering from the lower surface toward the upper surface of the first resin insulating layer.

18. The printed wiring board according to claim 15, wherein the opening portion of the first circuit board is formed such that the opening portion is tapering from the second surface toward the first surface of the first circuit board.

19. The printed wiring board according to claim 16, wherein the bottom portion of each of the first via conductors is formed such that the bottom portion is recessed from the third surface of the second circuit board.

20. The printed wiring board according to claim 15, wherein the second circuit board has a recessed portion connected to the opening portion of the first circuit board.

* * * * *